(12) United States Patent
Gupta

(10) Patent No.: US 9,190,988 B1
(45) Date of Patent: Nov. 17, 2015

(54) POWER MANAGEMENT SYSTEM FOR INTEGRATED CIRCUIT

(71) Applicant: Sunny Gupta, Noida (IN)

(72) Inventor: Sunny Gupta, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 6 days.

(21) Appl. No.: 14/447,635

(22) Filed: Jul. 31, 2014

(51) Int. Cl.
*H03K 3/012* (2006.01)

(52) U.S. Cl.
CPC ........................................ *H03K 3/012* (2013.01)

(58) Field of Classification Search
CPC ...................................................... H03K 3/012
USPC ........... 327/1, 50, 58, 62, 518, 520, 530, 538, 327/539
See application file for complete search history.

(56) References Cited

U.S. PATENT DOCUMENTS

| | | | |
|---|---|---|---|
| 5,563,504 A | 10/1996 | Gilbert | |
| 7,274,114 B1 * | 9/2007 | Wong | ............... 307/72 |
| 7,880,531 B2 | 2/2011 | Park | |
| 8,547,084 B2 | 10/2013 | Armstrong | |
| 8,624,653 B2 * | 1/2014 | Nagda et al. | ................... 327/307 |

OTHER PUBLICATIONS

Thomas Liebetrau, Ursula Kelling, Tobias Otter, and Magnus Hell, "Energy Saving in Automotive E/E Architectures", Infineon Technologies AG White Paper, Infineon Technologies AG, Neubiberg, Germany, Dec. 2012.
Ivar Hakon Lysfjord, "Multiple Power Domains", Department of Electronics and Telecommunications, Norwegian University of Science and Technology, Jun. 2008.

* cited by examiner

*Primary Examiner* — William Hernandez
(74) *Attorney, Agent, or Firm* — Charles Bergere

(57) ABSTRACT

A power management system for an integrated circuit (IC) includes low and full-power bandgap generators, first and second multiplexers, first circuitry, and a full-power regulator. When the IC is powered on, the first multiplexer selects the full-power bandgap generator as a reference voltage source for the first circuitry. After the low-power bandgap generator has been trimmed, the first multiplexer selects the low-power bandgap generator as the reference voltage source for the first circuitry. When the IC transitions from low power mode to high power mode, the second multiplexer selects the low-power bandgap generator as the reference voltage source for the full-power regulator. When the full-power bandgap generator is powered on, the second multiplexer selects the full-power bandgap generator as the reference voltage source for the full-power regulator.

15 Claims, 5 Drawing Sheets

POWER MANAGEMENT SYSTEM FOR INTEGRATED CIRCUIT

BACKGROUND OF THE INVENTION

The present invention relates generally to integrated circuits, and, more particularly, to a power management system for an integrated circuit.

Integrated circuits (ICs) including system-on-chips (SoCs) integrate various digital and sometimes also analog components on a single chip. Many ICs further include different power domains such as high and low power domains. The high power domain includes components that operate when the IC is in a high power mode and powered down when the IC is in a low power mode. The low power domain includes components that operate when the IC is in the high and low power modes. ICs with multiple power domains require multiple supply voltages that are provided by multiple voltage regulators. The high power domain is served by a high power voltage regulator (hereinafter referred to as a "full-power regulator") and the low power domain is served by a low power voltage regulator (hereinafter referred to as a "low-power regulator"). The low-power regulator is operational when the IC is in the low power mode and hence, the low-power regulator is designed to consume less power than the full-power regulator.

Such ICs also include a power management controller (PMC) that monitors the operating voltage of the IC. The PMC includes voltage monitoring circuits such as low-voltage detection (LVD) and high-voltage detection (HVD) circuits. The LVD circuits monitor the operating voltage of the IC and compare it with an LVD threshold voltage. The LVD threshold voltage represents the lowest voltage level at which the IC can operate without failing or deviating from the functional specification of the IC. Therefore, when the operating voltage drops below the LVD threshold voltage, the LVD circuit generates a safe-state signal to configure the IC in a reset or safe-state mode. Similarly, the HVD circuit configures the IC in the reset or safe-state mode when the operating voltage exceeds an HVD threshold voltage, in order to prevent the over-voltage condition from damaging the IC.

The above-mentioned voltage regulators and voltage monitoring circuits operate using reference voltage signals received from bandgap voltage reference generators. A bandgap voltage reference generator (hereinafter referred to as "bandgap generator") is a reference voltage circuit that outputs a reference voltage signal at a fixed voltage level irrespective of environmental changes such as ambient temperature changes, power supply variations and load variation. Generally, the low-power regulator and voltage monitoring circuits receive a first reference voltage signal from a low-power bandgap generator and the full-power regulator receives a second reference voltage signal from a full-power bandgap generator. The low-power regulator and voltage monitoring circuits are operational when the IC is in the low power mode. Therefore, the low-power bandgap generator also is operational when the IC is in the low power mode and hence, the low-power bandgap generator is designed to consume less power than the full-power bandgap generator.

FIG. 1 shows an IC 100 operable in high and low power modes and that has a conventional power management system 101. The power management system 101 includes a low-power bandgap generator 102 and first circuitry 104. When the IC 100 is in either the high or low power mode, the low-power bandgap generator 102 generates and provides a low-power bandgap reference voltage signal ($V_{LPBG\_REF}$) to the first circuitry 104. The first circuitry 104 includes a low-power regulator (not shown) and voltage monitoring circuits (not shown) such as LVD and HVD modules. For example, the first circuitry 104 may include an LVD module 106. The LVD module 106 receives the low-power bandgap reference voltage signal ($V_{LPBG\_REF}$) that is at a voltage level of a LVD threshold voltage and a supply voltage ($V_{SUPPLY}$) indicative of an operating voltage of the IC 100, and outputs an LVD signal (high active) when the supply voltage ($V_{SUPPLY}$) is greater than the low-power bandgap reference voltage signal ($V_{LPBG\_REF}$). To ensure proper operation of the LVD module 106, the LVD threshold voltage is designed to lie within a designated voltage range. When the IC 100 is powered on after a power-on-reset (POR), the low-power bandgap generator 102 is in an untrimmed condition for a first predetermined time period after the POR and hence, the accuracy of the low-power bandgap reference voltage signal ($V_{LPBG\_REFF}$) is low. The low-power bandgap generator 102 is trimmed and the low-power bandgap reference voltage signal ($V_{LPBG\_REF}$) is stabilized after the first predetermined time period after the POR.

During the first predetermined time period, the low-power bandgap reference voltage signal ($V_{LPBG\_REF}$) is unstable and has low accuracy and hence, may not be within the designated voltage range. Thus, the LVD module 106 may not assert when the supply voltage ($V_{SUPPLY}$) is less than the LVD threshold voltage, which could cause a failure or deviation from the functional specification of the IC 100. Further, low-power consumption requirements of the IC 100 constrain the efforts to design a high accuracy low-power bandgap generator. Designing an improved low-power bandgap generator 102 is difficult and requires additional components that result in an increase in the area overhead, power consumption and cost of production.

FIG. 2 shows an IC 200 operable in high and low power modes and that includes a conventional power management system 201. The power management system 201 includes a full-power bandgap generator 202, a soft-start circuit 204 connected to the full-power bandgap generator 202, a first multiplexer 206 connected to the soft-start circuit 204 and the full-power bandgap generator 202, and a full-power regulator 208 connected to the first multiplexer 206. When the IC 200 transitions from low power mode to high power mode, the full-power regulator 208 is powered on and operates in a voltage build-up phase. The full-power bandgap generator 202 is powered on and generates a full-power bandgap reference voltage signal ($V_{FPBG\_REF}$). The soft-start circuit 204 receives the full-power bandgap reference voltage signal ($V_{FPBG\_REF}$), and outputs an intermediate reference voltage signal ($V_{INT\_REF}$) having a controlled ramp-up rate. The first multiplexer 206 receives and outputs the intermediate reference voltage signal ($V_{INT\_REF}$) to the full-power regulator 208 when the full-power regulator 208 is in the voltage build-up phase.

When the voltage level of the intermediate reference voltage signal ($V_{INT\_REF}$) exceeds a first threshold voltage level, the soft-start circuit 204 generates a soft-start complete signal ($V_{SOFT\_START\_COMPLETE}$) to indicate the completion of the voltage build-up phase. The first multiplexer 206 receives the soft-start complete signal ($V_{SOFT\_START\_COMPLETE}$) at a select terminal thereof and outputs the full-power bandgap reference voltage signal ($V_{FPBG\_REF}$) to the full-power regulator 208. The full-power regulator 208 receives the full-power bandgap reference voltage signal ($V_{FPBG\_REF}$) and starts operating in a full-regulation phase. The full-power regulator 208 reaches a stable operation state in the full-regulation phase. Thus, when the IC 200 transitions from low power mode to high power mode, the full-power regulator 208 starts operating in the voltage build-up phase only when the full-power bandgap generator 202 is powered on. The time required for the IC 200 to transition from the low power mode to the high power mode is defined as a low power wake-up time. Since the full-power regulator 208 waits for the full-power bandgap generator 202 to be powered on, the low power wake-up time of the IC 200 increases. Thus, the performance of the IC 200 is affected.

It would be advantageous to have a power management system for an integrated circuit that provides accurate reference voltage to voltage regulators and voltage monitoring circuits to the integrated circuit, prevents damage and improves the performance of the integrated circuit, and overcomes the above-mentioned limitations of conventional power management systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
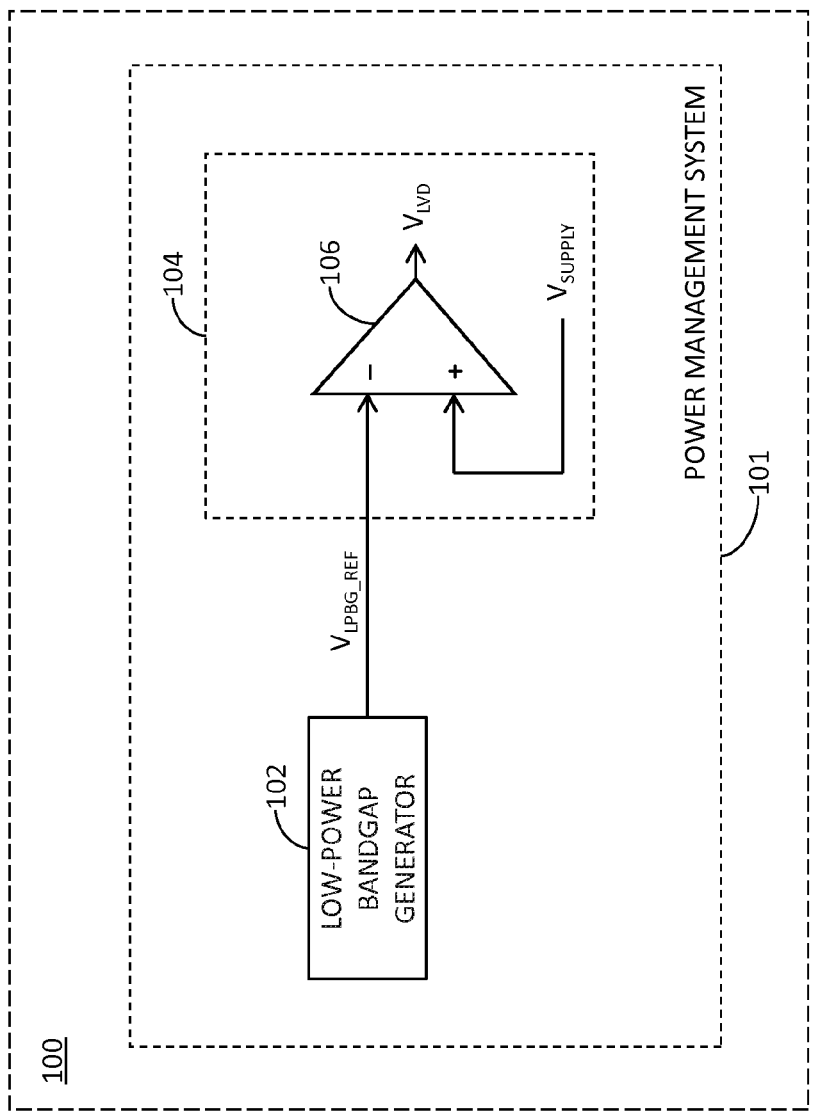
FIG. 1 is a schematic block diagram of a conventional power management system of an integrated circuit.
Figure 2:
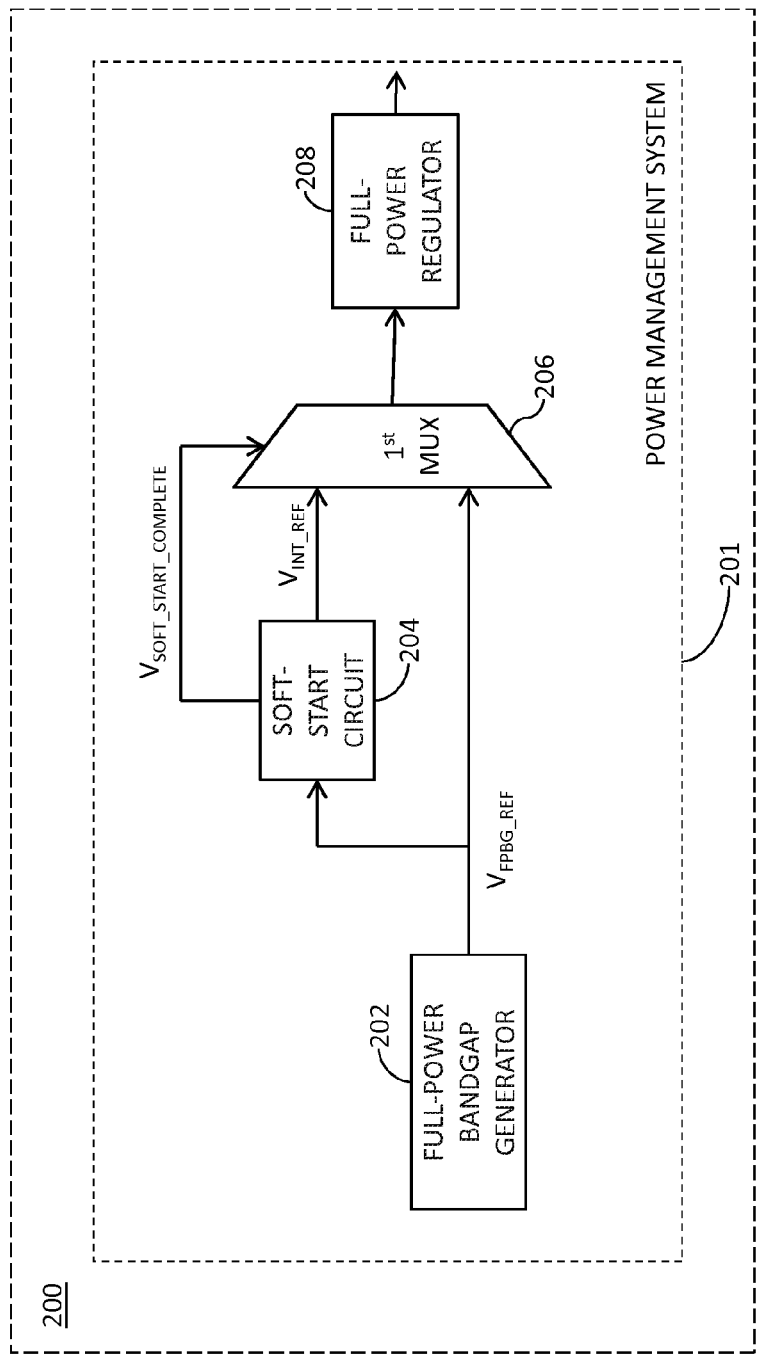
FIG. 2 is a schematic block diagram of another conventional power management system of an integrated circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a power management system for an integrated circuit (IC), where the IC is operable in a low power mode and a high power mode, is provided. The system includes low-power and full-power bandgap generators, a reset mode controller, a first multiplexer and first circuitry. The low-power bandgap generator is powered on when the IC enters high power mode after a power-on-reset (POR) and provides a first reference voltage signal when the IC is in the high and low power modes. The full-power bandgap generator is powered on when the IC enters the high power mode, provides a second reference voltage signal when the IC is in the high power mode, and is powered off when the IC is in the low power mode. The reset mode controller is connected to the low-power and full-power bandgap generators. The reset mode controller stabilizes the first and second reference voltage signals when the IC enters the high power mode after the POR, and generates a stabilization complete signal when the first reference voltage signal is stabilized. The reset mode controller stabilizes the first reference voltage signal in a first predetermined time period after the POR. The first multiplexer has a first input terminal connected to the low-power bandgap generator for receiving the first reference voltage signal, a second input terminal connected to the full-power bandgap generator for receiving the second reference voltage signal, a select input terminal connected to the reset mode controller for receiving the stabilization complete signal, and an output terminal for outputting one of the first and second reference voltage signals. First circuitry is connected to the output terminal of the first multiplexer. The first circuitry receives the second reference voltage signal during the first predetermined time period and the first reference voltage signal when the stabilization complete signal is generated (i.e., when the stabilization signal is active).

In another embodiment of the present invention, a power management system for an integrated circuit (IC) that is operable in low power and high power modes is provided. The system includes low-power and full-power bandgap generators, a first multiplexer, a soft-start circuit, and a full-power regulator. The low-power bandgap generator provides a first reference voltage signal (when the IC is in either of the low and high power modes). The full-power bandgap generator provides a second reference voltage signal when the IC is in the high power mode, and is powered off when the IC is in the low power mode. The soft-start circuit is connected to the low-power bandgap generator. The soft-start circuit receives the first reference voltage signal and generates an intermediate reference voltage signal when the IC transitions from the low power mode to the high power mode, and generates a soft-start complete signal when the intermediate reference voltage signal reaches a threshold voltage level. The intermediate reference voltage signal reaches the threshold voltage level within a first predetermined time period after the IC exits the low power mode and transitions to the high power mode. The first multiplexer has a first input terminal connected to the soft-start circuit for receiving the intermediate reference voltage signal, a second input terminal connected to the full-power bandgap generator for receiving the second reference voltage signal, a select input terminal connected to the soft-start circuit for receiving the soft-start complete signal, and an output terminal for outputting one of the intermediate and second reference voltage signals. The full-power regulator is connected to the output terminal of the first multiplexer and receives the intermediate reference voltage signal during the first predetermined time period and the second reference voltage signal when the soft-start complete signal is generated.

In yet another embodiment of the present invention, a power management system for an integrated circuit (IC) is provided, where the IC is operable in low and high power modes. The IC includes low-power and full-power bandgap generators, a reset mode controller, first and second multiplexers, first circuitry, a soft-start circuit, and a full-power regulator. The low-power bandgap generator is powered on when the IC enters the high power mode after a power-on-reset (POR) and provides a first reference voltage signal. The full-power bandgap generator is powered on when the IC enters the high power mode, provides a second reference voltage signal when the IC is in the high power mode, and is powered off when the IC is in the low power mode. The reset mode controller is connected to the low-power and full-power bandgap generators. The reset mode controller stabilizes the first and second reference voltage signals when the IC enters the high power mode after the POR, and generates a stabilization complete signal when the first reference voltage signal is stabilized. The reset mode controller stabilizes the first reference voltage signal within a first predetermined time period after the POR. The first multiplexer has a first input terminal connected to the low-power bandgap generator for receiving the first reference voltage signal, a second input terminal connected to the full-power bandgap generator for receiving the second reference voltage signal, a select input terminal connected to the reset mode controller for receiving the stabilization complete signal, and an output terminal for outputting one of the first and second reference voltage signals. The first circuitry is connected to the output terminal of the first multiplexer. The first circuitry receives the second reference voltage signal during the first predetermined time period and the first reference voltage signal when the stabilization complete signal is generated. The soft-start circuit is connected to the low-power bandgap generator. The soft-start circuit receives the first reference voltage signal and generates an intermediate reference voltage signal when the IC transitions from the low power mode to the high power mode, and generates a soft-start complete signal when the intermediate reference voltage signal reaches a threshold voltage level. The intermediate reference voltage signal reaches the threshold voltage level within a second predetermined time period after the IC exits the low power mode and transitions to the high power mode. The second multiplexer has a first input terminal connected to the soft-start circuit for receiving the intermediate reference voltage signal, a second input terminal connected to the full-power bandgap generator for receiving the second reference voltage signal, a select input terminal connected to the soft-start circuit for receiving the soft-start complete signal, and an output terminal for outputting one of the intermediate and second reference voltage signals. The full-power regulator is connected to the output terminal of the second multiplexer. The full-power regulator receives the intermediate reference voltage signal during the second predetermined time period and the second reference voltage signal when the soft-start complete signal is generated.

Various embodiments of the present invention provide a power management system for an IC that is operable in low power and high power modes. The system includes low-power and full-power bandgap generators, a reset mode controller, first and second multiplexers, first circuitry, a soft-start circuit, and a full-power regulator. The first circuitry includes components such as low-voltage detection (LVD) modules that are operational when the IC is in the low power mode. The low-power bandgap generator is powered on when the IC enters the high power mode after a power-on-reset (POR) and provides a first reference voltage signal. The full-power bandgap generator is powered on when the IC enters the high power mode, provides a second reference voltage signal when the IC is in the high power mode, and is powered off when the IC is in the low power mode.

The reset mode controller stabilizes the first and second reference voltage signals when the IC enters the high power mode after the POR, and generates a stabilization complete signal when the first reference voltage signal is stabilized. The reset mode controller stabilizes the first reference voltage signal within a first predetermined time period after the POR. During the first predetermined time period, the second reference voltage signal is more stable as compared to the first reference voltage signal, and hence the second reference voltage signal has a higher accuracy. The first multiplexer outputs the second reference voltage signal to the first circuitry during the first predetermined time period after the POR and outputs the first reference voltage signal to the first circuitry when the stabilization complete signal is generated.

The soft-start circuit receives the first reference voltage signal and generates an intermediate reference voltage signal when the IC transitions from the low power mode to the high power mode, and generates a soft-start complete signal when the intermediate reference voltage signal reaches a threshold voltage level. The intermediate reference voltage signal reaches the threshold voltage level within a second predetermined time period after the IC exits the low power mode and transitions to the high power mode. The second multiplexer outputs the intermediate reference voltage signal to the full-power regulator during the second predetermined time period and the second reference voltage signal to the full-power regulator when the soft-start complete signal is generated.

Thus, the first circuitry receives the second reference voltage signal when the first reference voltage signal is being stabilized, thereby receiving a stable reference voltage signal, and ensuring proper operation of the first circuitry. Further, when the IC transitions from the low power mode to the high power mode, the full-power regulator receives the intermediate reference voltage signal and starts operating. Since the full-power regulator is not required to wait for the full-power bandgap generator to be powered on, the low power wake-up time of the IC is fast, thereby improving the performance of the IC.

Figure 3:
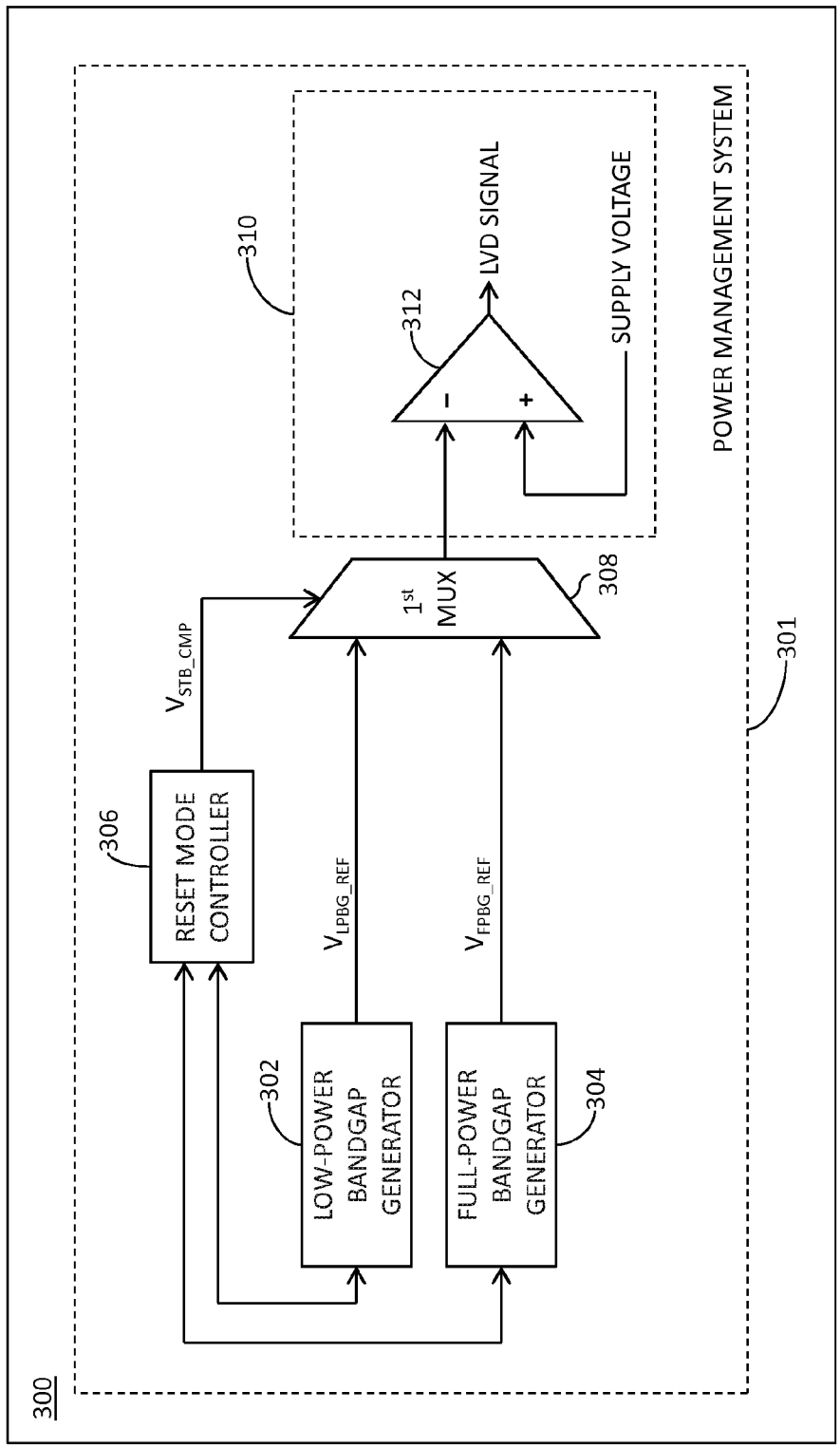
FIG. 3 is a schematic block diagram of a power management system of an integrated circuit in accordance with an embodiment of the present invention.

Referring now to FIG. 3, a schematic block diagram of an integrated circuit (IC) 300 in accordance with an embodiment of the present invention is shown. The IC 300 is operable in low power and high power modes and includes a power management system 301. The power management system 301 includes low-power and full-power bandgap generators 302 and 304, a reset mode controller 306, a first multiplexer or mux 308, and first circuitry 310.

The low-power bandgap generator 302 is used as a source of reference voltage for various components of the IC 300, such as the first circuitry 310, that are operational when the IC 300 is in the high and low power modes. When the IC 300 is powered on after a power-on-reset (POR), a power management controller (PMC, not shown) powers on the low-power bandgap generator 302. When the IC 300 is transitioning to the high power mode after the POR, the low-power bandgap generator 302 operates in an untrimmed condition, and hence generates an unstable first reference voltage signal ($V_{LPBG\_REF}$) having low accuracy. When the IC 300 is in the high and low power modes, the low-power bandgap generator 302 operates in a trimmed condition and hence, generates a stable first reference voltage signal ($V_{LPBG\_REF}$) having a higher accuracy as compared to the unstable first reference voltage signal ($V_{LPBG\_REF}$). Generally, to meet the low power consumption requirements of the low power mode, the low-power bandgap generator 302 is designed to consume less power than the full-power bandgap generator 304. Therefore, the low-power bandgap generator 302 is less accurate than the full-power bandgap generator 304. The low-power bandgap generator 302 includes a first set of switches that is switched on or off based on a first set of trimming codes. The operation state of the first set of switches determines a voltage level of the first reference voltage signal ($V_{LPBG\_REF}$), thereby allowing adjustments to be made to the voltage level of the first reference voltage signal ($V_{LPBG\_REF}$).

The full-power bandgap generator 304 is used as a source of reference voltage for various components of the IC 300, such as the full-power regulators (not shown) that are operational when the IC 300 is in the high power mode. When the IC 300 is powered on after a power-on-reset (POR), the PMC powers on the full-power bandgap generator 304. When the IC 300 transitions to the high power mode after the POR, the full-power bandgap generator 304 operates in the untrimmed condition and hence, generates an unstable second reference voltage signal ($V_{FPBG\_REF}$). When the IC 300 is in the high power mode, the full-power bandgap generator 304 operates in the trimmed condition and hence, generates a stable second reference voltage signal ($V_{FPBG\_REF}$) having higher accuracy than the unstable second reference voltage signal ($V_{FPBG\_REF}$). To meet the low power consumption requirements of the low power mode, the full-power bandgap generator 304 is switched off when the IC 300 is in the low power mode.

When the IC 300 transitions from the low power mode to the high power mode, the PMC powers on the full-power bandgap generator 304. Since the full-power bandgap generator 304 is not constrained by any low power consumption requirements, the full-power bandgap generator 304 is designed to be more accurate than the low-power bandgap generator 302. Due to the differences in the design and constitution between the low-power and full-power bandgap generators 302 and 304, the unstable second reference voltage signal ($V_{FPBG\_REF}$) is more accurate than the unstable first reference voltage signal ($V_{LPBG\_REF}$). The full-power bandgap generator 304 includes a second set of switches that is switched on or off based on a second set of trimming codes. The operational state of the second set of switches determines a voltage level of the second reference voltage signal ($V_{FPBG\_REF}$), thereby allowing adjustments to be made to the voltage level of the second reference voltage signal ($V_{FPBG\_REF}$).

The reset mode controller 306 is connected to the low-power and full-power bandgap generators 302 and 304. When the IC 300 transitions to the high power mode after the POR, the PMC powers on the reset mode controller 306 after the low-power and full-power bandgap generators 302 and 304 are powered on. The reset mode controller 306 retrieves the first and second sets of trimming codes from an internal memory (not shown) such as a ROM. The reset mode controller 306 controls the operational states of the first and second sets of switches by providing the first and second sets of trimming codes to the low-power and full-power bandgap generators 302 and 304, respectively. Thus, the reset mode controller 306 adjusts the voltage levels of the first and second reference voltage signals ($V_{LPBG\_REF}$ and $V_{FPBG\_REF}$) using the first and second sets of trimming codes, thereby stabilizing the first and second reference voltage signals ($V_{LPBG\_REF}$ and $V_{FPBG\_REF}$).

The reset mode controller 306 stabilizes the unstable first and second reference voltage signals ($V_{LPBG\_REF}$ and $V_{FPBG\_REF}$) within a first predetermined time period after the POR and generates a stabilization complete signal ($V_{STB\_CMP}$) when the first reference voltage signal ($V_{LPBG\_REF}$) is stabilized. The aforementioned procedure of adjusting the voltage levels of the first and second reference voltage signals ($V_{LPBG\_REF}$ and $V_{FPBG\_REF}$) is termed as trimming and is understood by those of skill in the art. Hence, further explanation thereof is not required for a complete understanding of the present invention.

The first mux 308 has a first input terminal connected to the low-power bandgap generator 302 for receiving the first reference voltage signal ($V_{LPBG\_REF}$), a second input terminal connected to the full-power bandgap generator 304 for receiving the second reference voltage signal ($V_{FPBG\_REF}$) a select input terminal connected to the reset mode controller 306 for receiving the stabilization complete signal ($V_{STB\_CMP}$), and an output terminal for outputting one of the first and second reference voltage signals ($V_{LPBG\_REF}$ and $V_{FPBG\_REF}$). When the IC 300 transitions to the high power mode after the POR, the first mux 308 outputs the second reference voltage signal ($V_{FPBG\_REF}$) for the first predetermined time period. After the first predetermined time period, the first mux 308 receives the stabilization complete signal ($V_{STB\_CMP}$) at its select input terminal and outputs the first reference voltage signal ($V_{LPBG\_REF}$).

The first circuitry 310 is connected to the output terminal of the first mux 308 for receiving the selected one of the first and second reference voltage signals ($V_{LPBG\_REF}$ and $V_{FPBG\_REF}$). The first circuitry 310 includes various analog and digital components that are operational when the IC 300 is in the low and high power modes. The first circuitry 310 may include a low-power regulator (not shown) and voltage monitoring circuits (not shown) such as LVD and HVD modules. For example, the first circuitry 310 includes an LVD module 312. The LVD module 312 has an inverting terminal connected to the output terminal of the first mux 308 for receiving the selected one of the first and second reference voltage signals ($V_{LPBG\_REF}$ and $V_{FPBG\_REF}$), a non-inverting terminal connected to a supply voltage indicative of an operating voltage of the IC 300, and an output terminal for generating an LVD signal when the supply voltage exceeds one of the first and second reference voltage signals ($V_{LPBG\_REF}$ and $V_{FPBG\_REF}$).

In operation, when the IC 300 is powered on after the POR, the PMC powers on the low-power and full-power bandgap generators 302 and 304. The PMC further powers on the reset mode controller 306. The low-power and full-power bandgap generators 302 and 304 generate the first and second reference voltage signals ($V_{LPBG\_REF}$ and $V_{FPBG\_REF}$), respectively, which may be unstable for the first predetermined time period. During the first predetermined time period, the first mux 308 outputs the second reference voltage signal ($V_{FPBG\_REF}$) to the first circuitry 310. The first circuitry 310 receives the second reference voltage signal ($V_{FPBG\_REF}$), which is more accurate than the first reference voltage signal ($V_{LPBG\_REF}$) at this time. Thus, the system 301 prevents malfunctioning of the first circuitry 310. Further, the need for designing an improved low-power bandgap generator 302 with higher accuracy is averted, thereby reducing cost of production, power consumption and area overhead of the IC 300.

During the first predetermined time period, the reset mode controller 306 retrieves the first set of trimming codes from the internal memory and trims the low-power bandgap generator 302, thereby stabilizing the first reference voltage signal ($V_{LPBG\_REF}$). The reset mode controller 306 then generates the stabilization complete signal ($V_{STB\_CMP}$). The first mux 308 receives the stabilization complete signal ($V_{STB\_CMP}$) and outputs the stable first reference voltage signal ($V_{LPBG\_REF}$) to the first circuitry 310. Thus, after the first predetermined time period, the low-power bandgap generator 302 provides the stable first reference voltage signal ($V_{LPBG\_REF}$) as a reference voltage to the first circuitry 310, thereby ensuring continuous operation of the first circuitry 310 when the IC 300 transitions from the high power mode to the low power mode.

Figure 4:
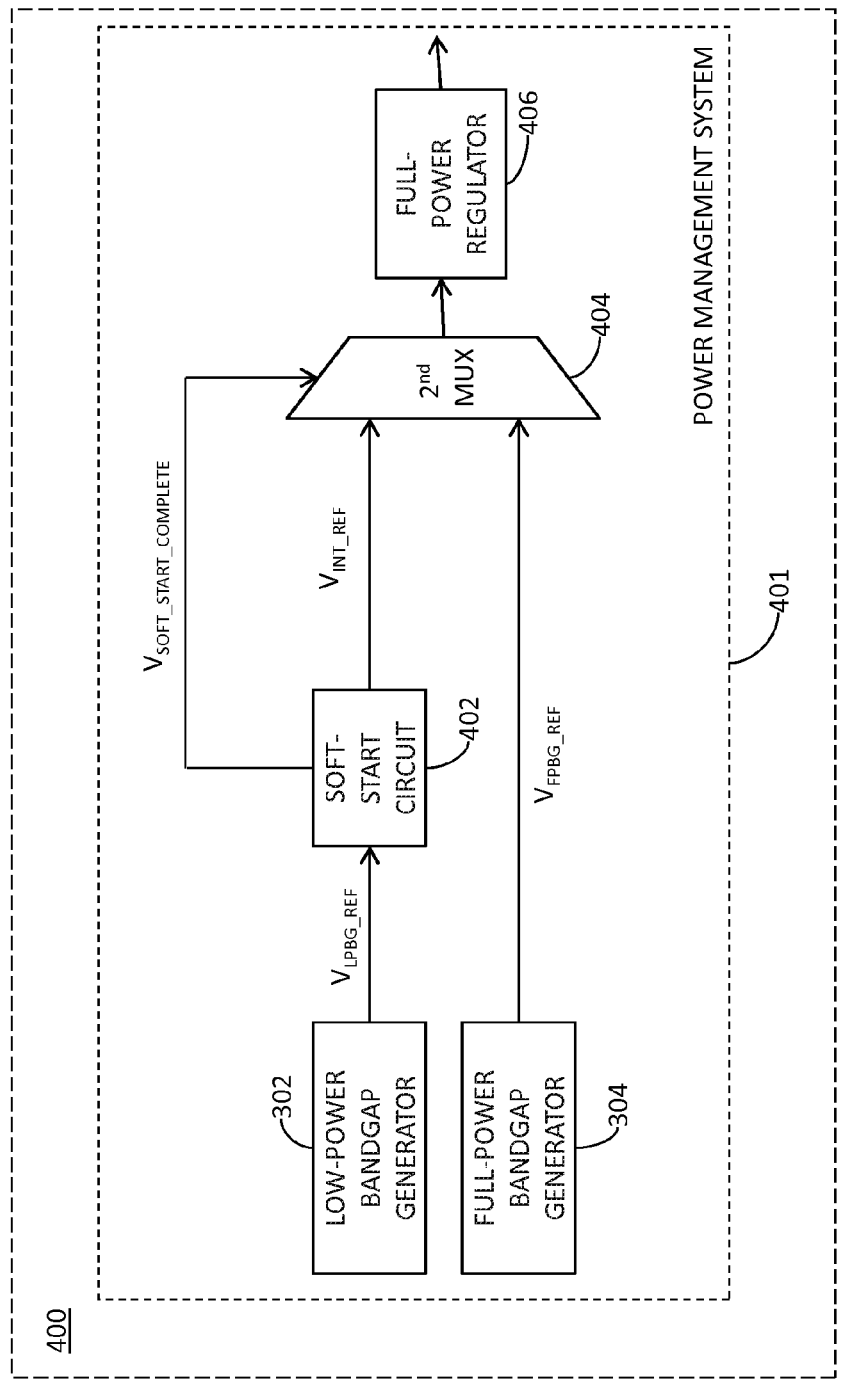
FIG. 4 is a schematic block diagram of a power management system of an integrated circuit in accordance with another embodiment of the present invention.

Referring now to FIG. 4, a schematic block diagram of an integrated circuit (IC) 400 in accordance with another embodiment of the present invention is shown. The IC 400 is operable in low power and high power modes, and includes high and low power domains (not shown). The IC 400 includes a power management system 401. The power management system 401 includes the low-power and full-power bandgap generators 302 and 304, a soft-start circuit 402, a second mux 404, and a full-power regulator 406. Generally, the full-power bandgap generator 304, the soft-start circuit 402 and the full-power regulator 406 are included in the high power domain.

The soft-start circuit 402 is connected to the low-power bandgap generator 302 for receiving the first reference voltage signal ($V_{LPBG\_REF}$) when the IC 400 transitions from the low power mode to the high power mode. The soft-start circuit 402 receives the first reference voltage signal ($V_{LPBG\_REF}$) and outputs an intermediate reference voltage signal ($V_{INT\_REF}$) having a controlled ramp-up rate based on the first reference voltage signal ($V_{LPBG\_REFF}$). The soft-start circuit 402 provides the intermediate reference voltage signal ($V_{INT\_REF}$) to the full-power regulator 406, thereby controlling the ramp-up rate of the full-power regulator 406. The intermediate reference voltage signal ($V_{INT\_REF}$) reaches a threshold voltage level within a second predetermined time period after the IC 400 exits the low power mode and transitions to the high power mode. The soft-start circuit 402 generates a soft-start complete signal ($V_{SOFT\_START\_COMPLETE}$) when the intermediate reference voltage signal ($V_{INT\_REF}$) reaches the threshold voltage level. The soft-start circuit 402 ceases to control the ramp-up rate of the full-power regulator 406 when the intermediate reference voltage signal ($V_{INT\_REF}$) exceeds the threshold voltage level. For example, the soft-start circuit 402 may include a slew rate controller (not shown) to limit an in-rush current to the full-power regulator 406 that receives the intermediate reference voltage signal ($V_{INT\_REF}$) during the second predetermined time period, thereby controlling the ramp-up rate of the full-power regulator 406. The in-rush current is generated due to abrupt powering up of the high power domain when the full-power regulator 406 is powered on without a controlled ramp-up rate.

The second mux 404 has a first input terminal connected to the soft-start circuit 402 for receiving the intermediate reference voltage signal ($V_{INT\_REF}$), a second input terminal connected to the full-power bandgap generator 304 for receiving the second reference voltage signal ($V_{FPBG\_REF}$) a select input terminal connected to the soft-start circuit 402 for receiving the soft-start complete signal ($V_{SOFT\_START\_COMPLETE}$), and an output terminal for outputting one of the intermediate and second reference voltage signals ($V_{INT\_REF}$ and $V_{FPBG\_REF}$) to the full-power regulator 406. When the IC 400 transitions from the low power mode to the high power mode, the second mux 404 outputs the intermediate reference voltage signal ($V_{INT\_REF}$) to during the second predetermined time period. After the second predetermined time period, the second mux 404 receives the soft-start complete signal ($V_{SOFT\_START\_COMPLETE}$) at its select input terminal and outputs the second reference voltage signal ($V_{FPBG\_REF}$).

The full-power regulator 406 is connected to the output terminal of the second mux 404 for receiving the selected one of the first and second reference voltage signals ($V_{LPBG\_REF}$ and $V_{FPBG\_REF}$). The full-power regulator 406 is operational when the IC 400 is in the high power mode and is switched off when the IC 400 is in the low power mode. When the IC transitions from the low power mode to the high power mode, the full-power regulator 406 is powered on and the soft-start circuit 402 provides the intermediate reference voltage signal ($V_{INT\_REF}$) to the full-power regulator 406, thereby controlling the ramp-up rate of the full-power regulator 406. The full-power regulator 406 receives one of the intermediate and second reference voltage signals ($V_{INT\_REF}$ and $V_{FPBG\_REF}$) as a reference voltage signal and regulates an output voltage signal at a first voltage level based on the reference voltage signal.

In operation, when the IC 400 transitions from the low power mode to the high power mode, the PMC powers on the soft-start circuit 402 and the full-power bandgap generator 304. Since the IC 400 transitions from the low power mode, the low-power bandgap generator 302 is operational and generates the stable first reference voltage signal ($V_{LPBG\_REF}$) while the IC 400 transitions from the low power mode to the high power mode. The soft-start circuit 402 receives the stable first reference voltage signal ($V_{LPBG\_REF}$) and outputs the intermediate reference voltage signal ($V_{INT\_REF}$). The second mux 404 receives and outputs the intermediate reference voltage signal ($V_{INT\_REF}$) to the full-power regulator 406 during the second predetermined time period. Thus, when the IC 400 transitions from the low power mode to the high power mode, the full-power regulator 406 starts operating as the low-power bandgap generator 302 is operational. Therefore, the time required for the IC 400 to transition from the low power mode to the high power mode decreases because the full-power regulator 406 does not have to wait for the full-power bandgap generator 304 to be powered on and operational. Thus, the low-power wakeup time of the IC 400 is reduced (the IC 400 wakes up faster) and so the performance of the IC 400 is improved.

During the second predetermined time period, the full-power bandgap generator 304 powers on, starts operating, and generates the second reference voltage signal ($V_{FPBG\_REF}$). After the second predetermined time period, the intermediate reference voltage signal ($V_{INT\_REF}$) exceeds the threshold voltage level so the soft-start circuit 402 generates the soft-start complete signal ($V_{SOFT\_START\_COMPLETE}$). The second mux 404 receives the soft-start complete signal ($V_{SOFT\_START\_COMPLETE}$) and outputs the second reference voltage signal ($V_{FPBG\_REF}$) to the full-power regulator 406. Thus, the reference voltage to the full-power regulator 406 is switched between the first and second reference voltage signals ($V_{LPBG\_REF}$ and $V_{FPBG\_REF}$) to reduce the transition time of the IC 400 from the low power mode to the high power mode.

Figure 5:
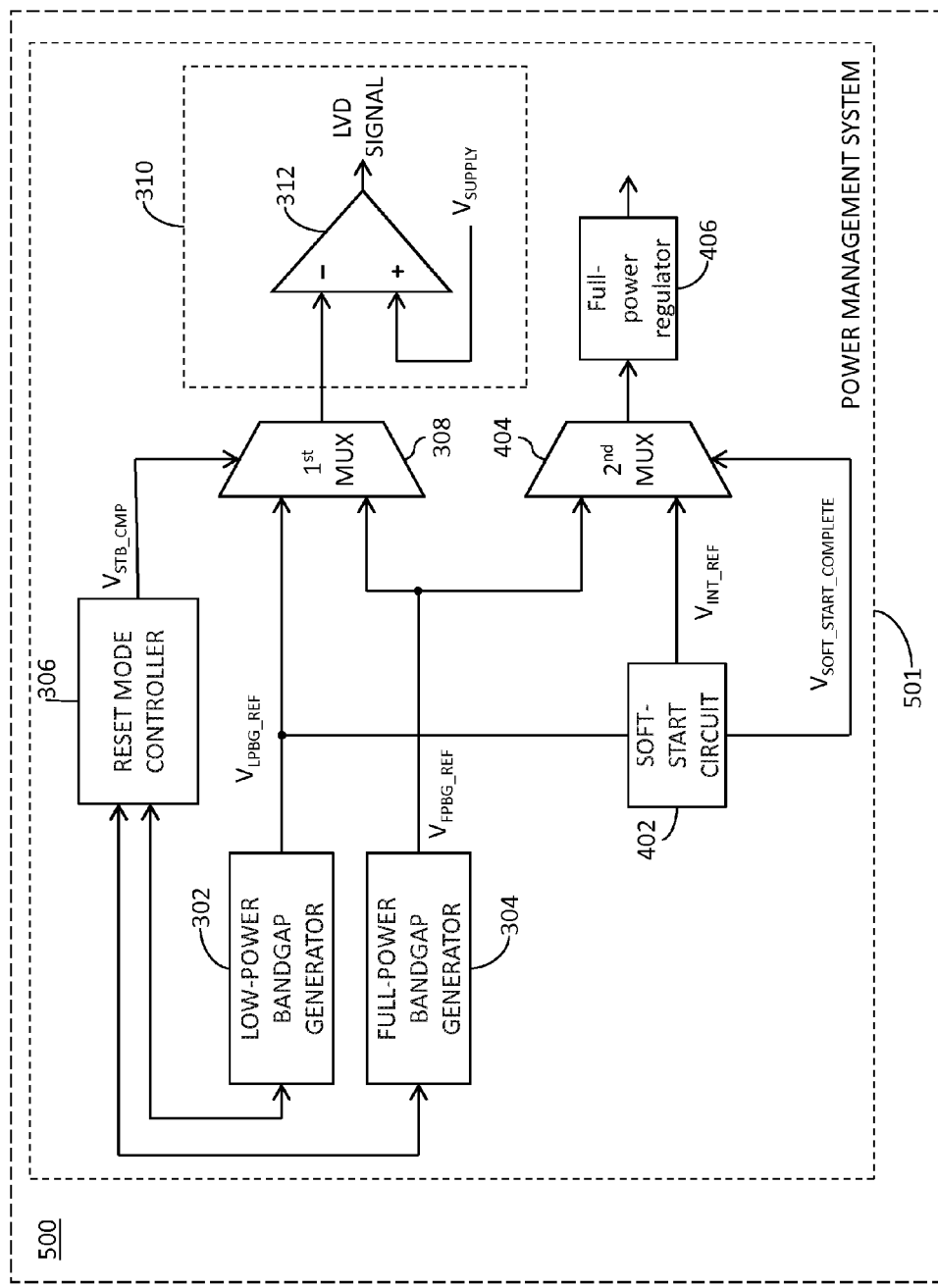
FIG. 5 is a schematic block diagram of a power management system of an integrated circuit in accordance with yet another embodiment of the present invention.

Referring now to FIG. 5, a schematic block diagram of an integrated circuit (IC) 500 in accordance with yet another embodiment of the present invention is shown. The IC 500 is operable in low power and high power modes and includes a power management system 501. The power management system 501 is implemented using a combination of the power management systems 301 and 401 and includes the low-power and full-power bandgap generators 302 and 304, the reset mode controller 306, the first mux 308, the first circuitry 310, the soft-start circuit 402, the second mux 404, and the full-power regulator 406. The IC 500 is functionally similar to ICs 300 and 400 as described in FIGS. 3 and 4, thus the explanation of these components is not repeated.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:
1. A power management system for an integrated circuit (IC) operable in a low power mode and a high power mode, the system comprising:
a low-power bandgap generator that is powered on when the IC enters the high power mode after a power-on-reset (POR), and provides a first reference voltage signal when the IC is in either of the high and low power modes;
a full-power bandgap generator that is powered on when the IC enters the high power mode, and provides a second reference voltage signal when the IC is in the high power mode, and is powered off when the IC is in the low power mode;

a reset mode controller, connected to the low-power and full-power bandgap generators, that stabilizes the first and second reference voltage signals when the IC enters the high power mode after the POR, and generates a stabilization complete signal when the first reference voltage signal is stabilized, wherein the first reference voltage signal is stabilized in a first predetermined time period after the POR;

a first multiplexer that has a first input terminal connected to the low-power bandgap generator for receiving the first reference voltage signal, a second input terminal connected to the full-power bandgap generator for receiving the second reference voltage signal, a select input terminal connected to the reset mode controller for receiving the stabilization complete signal, and an output terminal for outputting one of the first and second reference voltage signals; and first circuitry, connected to the first multiplexer output terminal, for receiving the second reference voltage signal during the first predetermined time period and the first reference voltage signal when the stabilization complete signal is generated.

2. The power management system of claim 1, wherein the reset mode controller adjusts operational parameters of the low-power and full-power bandgap generators for stabilizing the first and second reference voltage signals when the IC enters the high power mode after the POR.

3. The power management system of claim 1, wherein the first circuitry includes at least one of a low-voltage detection (LVD) module and a low-power regulator.

4. A power management system for an integrated circuit (IC) operable in a low power mode and a high power mode, the system comprising:

a low-power bandgap generator that provides a first reference voltage signal;

a full-power bandgap generator that provides a second reference voltage signal when the IC is in the high power mode, and is powered off when the IC is in the low power mode;

a soft-start circuit, connected to the low-power bandgap generator, for receiving the first reference voltage signal and generating an intermediate reference voltage signal when the IC transitions from the low power mode to the high power mode, and generating a soft-start complete signal when the intermediate reference voltage signal reaches a threshold voltage level, wherein the intermediate reference voltage signal reaches the threshold voltage level in a first predetermined time period after the IC exits the low power mode and transitions to the high power mode;

a first multiplexer that has a first input terminal connected to the soft-start circuit for receiving the intermediate reference voltage signal, a second input terminal connected to the full-power bandgap generator for receiving the second reference voltage signal, a select input terminal connected to the soft-start circuit for receiving the soft-start complete signal, and an output terminal for outputting one of the intermediate and second reference voltage signals; and a full-power regulator, connected to the output terminal of the first multiplexer, for receiving the intermediate reference voltage signal during the first predetermined time period and the second reference voltage signal when the soft-start complete signal is active.

5. The power management system of claim 4, wherein the full-power bandgap generator is powered on when the IC transitions from the low power mode to the high power mode.

6. The power management system of claim 4, wherein the full-power regulator receives one of the intermediate and second reference voltage signals as a reference voltage signal and regulates an output voltage signal at a first voltage level based on the reference voltage signal.

7. The power management system of claim 4, wherein the soft-start circuit generates the intermediate reference voltage signal for controlling a ramp-up rate of the full-power regulator when the IC transitions from the low power mode to the high power mode.

8. The power management system of claim 4, wherein the full-power regulator is powered off when the IC is in the low power mode and powered on when the IC transitions from the low power mode to the high power mode.

9. A power management system for an integrated circuit (IC), wherein the IC is operable in a low power mode and a high power mode, the system comprising:

a low-power bandgap generator that is powered on when the IC enters the high power mode after a power-on-reset (POR), and generates a first reference voltage signal;

a full-power bandgap generator that is powered on when the IC enters the high power mode, provides a second reference voltage signal when the IC is in the high power mode, and is powered off when the IC is in the low power mode;

a reset mode controller, connected to the low and full-power bandgap generators, for stabilizing the first and second reference voltage signals when the IC enters the high power mode after the POR, and generating a stabilization complete signal when the first reference voltage signal is stabilized, wherein the first reference voltage signal is stabilized within a first predetermined time period after the POR;

a first multiplexer that has a first input terminal connected to the low-power bandgap generator for receiving the first reference voltage signal, a second input terminal connected to the full-power bandgap generator for receiving the second reference voltage signal, a select input terminal connected to the reset mode controller for receiving the stabilization complete signal, and an output terminal for outputting one of the first and second reference voltage signals;

first circuitry, connected to the output terminal of the first multiplexer, that receives the second reference voltage signal during the first predetermined time period and the first reference voltage signal when the stabilization complete signal is active;

a soft-start circuit, connected to the low-power bandgap generator, that receives the first reference voltage signal and generates an intermediate reference voltage signal when the IC transitions from the low power mode to the high power mode, and generates a soft-start complete signal when the intermediate reference voltage signal reaches a threshold voltage level, wherein the intermediate reference voltage signal reaches the threshold voltage level within a second predetermined time period after the IC exits the low power mode and transitions to the high power mode;

a second multiplexer that has a first input terminal connected to the soft-start circuit for receiving the intermediate reference voltage signal, a second input terminal connected to the full-power bandgap generator for receiving the second reference voltage signal, a select input terminal connected to the soft-start circuit for receiving the soft-start complete signal, and an output terminal for outputting one of the intermediate and second reference voltage signals; and a full-power regulator, connected to the output terminal of the second multiplexer, for receiving the intermediate reference voltage signal during the second predetermined time period and the second reference voltage signal when the soft-start complete signal is active.

10. The power management system of claim 9, wherein the reset mode controller adjusts operational parameters of the low-power and full-power bandgap generators for stabilizing the first and second reference voltage signals when the IC enters the high power mode after the POR.

11. The power management system of claim 9, wherein the first circuitry includes at least one of a low-voltage detection (LVD) module and a low-power regulator.

12. The power management system of claim 9, wherein the full-power bandgap generator is powered on when the IC transitions from the low power mode to the high power mode.

13. The power management system of claim 9, wherein the full-power regulator receives at least one of the intermediate and second reference voltage signals as a reference voltage signal and regulates an output voltage signal at a first voltage level based on the reference voltage signal.

14. The power management system of claim 9, wherein the soft-start circuit generates the intermediate reference voltage signal for controlling a ramp-up rate of the full-power regulator when the IC transitions from the low power mode to the high power mode.

15. The power management system of claim 9, wherein the full-power regulator is powered off when the IC is in the low power mode and is powered on when the IC transitions from the low power mode to the high power mode.

* * * * *